(12) United States Patent
Mayer et al.

(10) Patent No.: US 8,866,225 B2
(45) Date of Patent: Oct. 21, 2014

(54) FIELD EFFECT TRANSISTOR WITH ALTERNATE ELECTRICAL CONTACTS

(75) Inventors: Frederic Mayer, Voiron (FR); Laurent Clavelier, St. Egreve (FR); Thierry Poiroux, Voiron (FR); Gerard Billiot, St. Nazaire les Eymes (FR)

(73) Assignee: Commissariat a l'Energie Atomique, Paris (FR)

( * ) Notice: Subject to any disclaimer, the term of this patent is extended or adjusted under 35 U.S.C. 154(b) by 683 days.

(21) Appl. No.: 12/665,463

(22) PCT Filed: Jun. 19, 2008

(86) PCT No.: PCT/EP2008/057773
§ 371 (c)(1),
(2), (4) Date: Dec. 18, 2009

(87) PCT Pub. No.: WO2008/155379
PCT Pub. Date: Dec. 24, 2008

(65) Prior Publication Data
US 2010/0155843 A1    Jun. 24, 2010

(30) Foreign Application Priority Data
Jun. 21, 2007  (FR) .................... 07 55936

(51) Int. Cl.
*H01L 27/12* (2006.01)
*H01L 29/78* (2006.01)
*H01L 29/66* (2006.01)
*H01L 29/417* (2006.01)

(52) U.S. Cl.
CPC ...... *H01L 29/7855* (2013.01); *H01L 29/66795* (2013.01); *H01L 29/41791* (2013.01)
USPC ........... 257/347; 257/270; 257/330; 257/331; 257/332; 257/333; 257/334; 257/E21.455; 257/E29.275

(58) Field of Classification Search
CPC ........... H01L 29/785; H01L 29/66795; H01L 27/10879; H01L 27/10802; H01L 21/845
USPC ............... 257/270, 330, 331, 332, 333, 334, 257/E29.275, E21.455, 347
See application file for complete search history.

(56) References Cited

U.S. PATENT DOCUMENTS 5,382,832 A   1/1995 Buti et al.
6,765,303 B1  7/2004 Krivokapic et al.
(Continued)

FOREIGN PATENT DOCUMENTS

FR        2 910 704        6/2005
WO    WO 2006/087798 A1    8/2006

OTHER PUBLICATIONS

Jakub Kedzierski, et al., "Extension and Source/Drain Design for High-Performance FinFET Devices", IEEE Transactions on Electron Devices, vol. 50, No. 4, Apr. 2003, pp. 952-958.

(Continued)

*Primary Examiner* — Anthony Ho
*Assistant Examiner* — David Chen
(74) *Attorney, Agent, or Firm* — Oblon, Spivak, McClelland, Maier & Neustadt, L.L.P.

(57) ABSTRACT

A field effect transistor including: a support layer, a plurality of active zones based on a semiconductor, each active zone configured to form a channel and arranged between two gates adjacent to each other and consecutive, the active zones and the gates being arranged on the support layer, each gate including a first face on the side of the support layer and a second face opposite the first face. The second face of a first of the two gates is electrically connected to a first electrical contact made on the second face of the first of the two gates, and the first face of a second of the two gates is electrically connected to a second electrical contact passing through the support layer. The gates of the transistor are not electrically connected to each other.

14 Claims, 9 Drawing Sheets

(56) References Cited

U.S. PATENT DOCUMENTS

| | | | |
|---|---|---|---|
| 7,087,966 | B1 | 8/2006 | Anderson et al. |
| 7,102,181 | B1 | 9/2006 | Nowak et al. |
| 2005/0073005 | A1 | 4/2005 | Nowak et al. |
| 2005/0191818 | A1 | 9/2005 | Marty et al. |
| 2005/0212018 | A1 | 9/2005 | Schoellkopf et al. |
| 2005/0214988 | A1 | 9/2005 | Campbell et al. |
| 2005/0224994 | A1 | 10/2005 | Tiwari et al. |
| 2006/0249799 | A1* | 11/2006 | Abadeer et al. ............... 257/401 |
| 2006/0267111 | A1* | 11/2006 | Anderson et al. ............. 257/401 |
| 2007/0284661 | A1* | 12/2007 | Yamada et al. ............... 257/347 |
| 2007/0296014 | A1* | 12/2007 | Nakajima ..................... 257/308 |

OTHER PUBLICATIONS

L. Mathew, et al., "Multiple Independent Gate Field Effect Transistor (MIGFET)—Multi-Fin RF Mixer Architecture, Three Independent Gates (MIGFET-T) Operation and Temperature Characteristics", 2005 Symposium on VLSI Technology Digest of Technical Papers, 4-900784-00-1, 2005, pp. 200-201.

Kaushik Roy, et al., "Double-Gate SOI Devices for Low-Power and High-Performance Applications", IEEE, 0-7803-9254-X, 2005, pp. 217-224.

Weimin Zhang, et al., "Physical Insights Regarding Design and Performance of Independent-Gate FinFETs", IEEE Transactions on Electron Devices, vol. 52, No. 10, Oct. 2005, pp. 2198-2206.

Julie Widiez, et al., "Experimental Comparison Between Sub-0.1-μm Ultrathin SOI Single- and Double-Gate MOSFETs: Performance and Mobility", IEEE Transactions on Nanotechnology, vol. 5, No. 6, Nov. 2006, pp. 643-648.

* cited by examiner

FIELD EFFECT TRANSISTOR WITH ALTERNATE ELECTRICAL CONTACTS

TECHNICAL FIELD AND PRIOR ART

The invention relates to field effect transistors and particularly FinFET (Fin Field Effect Transistors).

So-called "multi-gate" devices, for example such as FinFETs, have been developed to overcome the disadvantages related to the reduction in the size of CMOS transistors and particularly the increase in energy consumption due to leaks in these transistors and the increase in technological constraints. FinFET transistors provide better electrostatic control than CMOS transistors, giving a better slope under the threshold and therefore a lower leakage current in the blocked state, and a higher current in the conducting state due to the existence of several transport channels. In particular, these gates may be independent of each other, for example so that the threshold voltage can be modulated by means of the second gate.

FIG. 1 shows an example of a FinFET 1. The FinFET 1 comprises a source 2, a drain 4 and n fingers 6 each forming two channels parallel to each other and made on an oxide layer 8 of an initial SOI (silicon on insulator) substrate. In this example in FIG. 1, the FinFET 1 comprises three fingers 6 formed on one face of the oxide layer 8. Each finger 6 comprises a portion of active zone 10 with thickness $T_{Si}$ on which a hard mask portion 12 is formed, and finally a gate 14 with length $L_G$ made above the hard mask portion 12 and on the sides of the hard mask 12 and the active zone 10. Conduction between the active zone 10 and the gate 14 takes place at the sides, the hard mask 12 preventing conduction between the gate 14 and the active zone 10 at the upper face of the active zone 10. In such a FinFET with connected gates (the different gates 14 are electrically connected to each other), the current density circulating in the active zones 10 is proportional to the value $W_{eq}=n \times 2 \times T_{Si}$. Therefore the integration density of the FinFET 1 is directly dependent on the ability to minimise the space between the fingers 6.

Prior art also discloses how FinFETs with disconnected gates can be made, in other words with gates in contact with the sides of the active zones and that are not electrically connected to each other. In this case, the gate voltages to be applied to the FinFET 1 for each gate are independent from each other, so that the threshold voltage related to one of the gates can be modulated relative to the threshold voltage related to the other gate.

One method of making a FinFET with disconnected gates 20 is described with reference to FIGS. 2A to 2E.

The first step is to make the structure shown in FIG. 2A comprising a substrate 22, a buried oxide layer 24, an active layer 26 based on a semiconductor, for example Si, and a hard mask layer 28.

The fingers, in other words the channels of the FinFET 20, are formed by an electron beam photolithography step and a step to etch the hard mask 28 and the active layer 26 (FIG. 2B).

As shown in FIG. 2C, the next step is to deposit a gate stack formed by a gate dielectric material 29 such as $SiO_2$ and a gate material 30 such as polycrystalline Si, on the oxide layer 24, also covering the fingers of the FinFET 20.

The next step is planarization, for example mechanical-chemical planarization stopping on the hard mask layer 28 (FIG. 2D).

Finally, electrical contacts are made above each gate 30. This is done by depositing a dielectric material 31 on the entire structure. Vias or contact holes 32, and metallic portions 34, are then made in this dielectric layer 31 by lithography, etching and metal deposit. The assembly is then planarized as shown in FIG. 2E.

In such a FinFET with disconnected gates, the dimensions of the channel zones, gates, vias and metallic portions are subject to constraints. The most restrictive design rule may be either the minimum pitch between two consecutive metallic portions 34 ("Pitch$_{portion}$" in FIG. 2E), or the minimum pitch between two gate 30/active layer 26/via 32 assemblies ("Pitch$_{via}$" in FIG. 2E), taking account of the possible misalignment of vias 32. For example, for the 45 nm technological node, the design rule for the width of a finger is equal to approximately 9 nm. The width of the gate 30 and of the metallic portion 34 and the via 32 is equal to approximately 45 nm. The maximum misalignment of vias 32 is equal to about 13 nm (value within 5 times the standard deviation). Therefore, the minimum pitch to prevent short circuiting two gates is equal to about 58 nm (13 nm+45 nm) for the gate 30/active layer 26/via 32 assembly. The minimum pitch for making metallic portions 34 is about 90 nm. Therefore the minimum pitch of metallic portions 34 is larger than the pitch of the gate 30/active layer 26/via 32 assembly. Therefore, the metallic portions 34 impose the distance between two channel zones of the active layer 26, in other words the distance between two fingers of the FinFET.

Therefore, it can be seen that rules for the design of electrical contacts are restrictive and limit the integration density of such transistors in this type of structure.

DESCRIPTION OF THE INVENTION

One purpose of this invention is to disclose a field effect transistor with better integration density.

To achieve this, this invention discloses a field effect transistor comprising at least:
- a support layer,
- an active zone based on at least one semiconductor, designed to form a channel, arranged on one face of the support layer, between a first gate and a second gate made on said face of the support layer and each comprising a first face on the side of the support layer and a second face opposite the first face,
- a first electrical contact made on the second face of the first gate and electrically connected to the second face of the first gate, and a second electrical contact passing through the support layer and electrically connected to the first face of the second gate.

This invention can improve the integration density of a field effect transistor like a FinFET with disconnected gates, by relaxing the constraint on the dimensions of the electrical contacts, and only connecting one gate out of two per face.

In this new approach, the minimum pitch of electrical contacts is twice as much as in devices according to prior art. Therefore, it is the gate/active zone/via assembly that imposes the minimum distance between the fingers.

The invention also relates to a field effect transistor comprising at least:
- a support layer,
- a plurality of active zones based on at least one semiconductor, each active zone being designed to form a channel and arranged between two gates adjacent to each other and consecutive, the active zones and the gates being arranged on the support layer, each gate comprising a first face on the side of the support layer and a second face opposite the first face,
- the second face of a first of the two gates being electrically connected to a first electrical contact made on the second face of said first of the two gates, and the first face of a second of the two gates being electrically connected to a second electrical contact passing through the support layer, the gates of the transistor not being electrically connected to each other.

The result is a transistor comprising gates that are not electrically connected to each other, in other words they are electrically isolated from each other, and comprising electrical alternated contacts at the two opposite faces of the transistor. Therefore all transistor gates are independent of each other, this electrical isolation also being made between the gates electrically connected to electrical contacts formed on a single face of the transistor. Therefore, the improvement in the integration density can be applied to disconnected gate transistors such as FinFETs.

Preferably, the support layer may comprise recesses in which the gates may be arranged.

The support layer may be based on at least one dielectric material such as $SiO_2$ and/or $Al_2O_3$ and/or nitride and/or diamond and/or based on at least one material that can be selectively etched relative to the other materials in the transistor, such as Si and/or Ge and/or SiGe.

The transistor may also include a hard mask portion located on the active zone(s).

The hard mask portion may comprise at least one oxide layer such as $SiO_2$ and/or a nitride layer.

The active zone(s) may be based on at least one stressed or unstressed semiconductor such as Si and/or Ge and/or SiGe and/or any type III-V semiconductor.

Gates may be based on at least one metallic material and/or polysilicon.

The first and second gates may be partly surrounded by at least one gate dielectric based on a dielectric material such as SiON and/or $SiO_2$ and/or $HfO_2$.

The transistor may also comprise a dielectric material such as $SiO_2$, at least partly covering portions of the support layer and forming isolation trenches such as shallow isolation trenches.

The first and/or second electrical contact may also comprise silicide portions formed in contact with the first and/or second face of the first and/or second gate, or the first and/or second of the two gates.

The transistor may comprise silicide portions formed on the source and drain zones of the transistor.

The first and/or second electrical contact may each comprise a via based on a first conducting material and a metallic portion based on a second conducting material, the via being arranged between the metallic portion and the first and/or second gate, or between the metallic portion and the first and/or second of the two gates.

The transistor may also comprise dielectric spacers arranged on the support layer and at least in contact with the gates.

The transistor may also comprise:
a plurality of active zones based on at least one semiconductor, each active zone possibly being arranged between two gates located adjacent to each other and consecutive, the active zones and the gates possibly being arranged on the support layer, each gate possibly comprising a first face on the side of the support layer and a second face opposite the first face,
the second face of one of the two gates possibly being electrically connected to a first electrical contact made on the second face of said one of the two gates, and the first face of the other of the two gates possibly being connected to a second electrical contact passing through the support layer.

The transistor may also comprise source and drain zones formed on said face of the support layer and electrically connected to electrical contacts passing through the support layer and made on the side of said face of the support layer and/or on the side of a face opposite said face of the support layer.

Another purpose of the invention is to propose a method for making a field effect transistor such as a self-aligned and independent double gate transistor which is easier to implement than methods according to prior art.

This invention also relates to a method for making a field effect transistor, comprising at least the following steps:
photolithography and etching of at least two gate locations in an active layer based on at least one semiconductor and arranged on a support layer, forming at least one active zone that will form a channel in the active layer and between the locations of the gates,
deposit a gate material at least in the gate locations, forming first and second gates each comprising a first face on the side of the support layer and a second face opposite the first face,
make at least a first electrical contact on the second face of the first gate, this first contact being electrically connected to the second face of the first gate,
make at least one second electrical contact electrically connected to the first face of the second gate, through the support layer.

The invention also relates to a method for making a field effect transistor comprising at least the following steps:
photolithography and etching of a plurality of gate locations in an active layer based on at least one semiconductor and arranged on a support layer, forming a plurality of active zones in the active layer, each being designed to form a channel and being arranged between two gate locations adjacent to each other and consecutive,
deposit a gate material in at least the gate locations, forming a plurality of gates each comprising a first face on the side of the support layer and a second face opposite the first face, each active zone being arranged between two gates located adjacent to each other and consecutive,
make at least one first electrical contact on the second face of a first of the two gates, this first contact being electrically connected to the second face of said first of the two gates,
make at least one second electrical contact through the support layer, electrically connected to the first face of a second of the two gates,
the gates of the transistor not being electrically connected to each other.

The gate locations may also be partly etched in the support layer.

The method may also comprise a step to deposit a hard mask like an LPCVD deposit on the active layer before the photolithography and etching step, the locations of the gates also being etched through the hard mask.

The method may also comprise a step to deposit a gate dielectric at least in the gate locations, between the gate location photolithography and etching step and the step to deposit the gate material, the gate material being deposited on this gate dielectric.

The method may also comprise a step to implant doping agents in zones of the active layer that will form source and drain zones of the transistor between the step to deposit the gate material and the step to make the first electrical contact.

The method may also comprise a step to make dielectric spacers on the support layer and at least in contact with the gates, between the step to deposit the gate material and the step to make the first electrical contact.

In this case, the method may also comprise a step to deposit a dielectric material on parts of the support layer not covered by the gate material or the active layer or spacers, forming isolation trenches, between the step to make the spacers and the step to make the first electrical contact.

The method may also comprise a mechanical-chemical planarization step stopping on the active layer, or stopping on the hard mask if the transistor comprises a hard mask located on the active layer, between the step to deposit the gate material and the step to make the first electrical contact.

The method also comprises a step to silicate the gate material and/or zones of the active layer that will form source and drain zones of the transistor, between the step to deposit the gate material and the step to make the first electrical contact.

The first electrical contact may be made using at least the following steps:
  deposit a dielectric layer on the active layer and on the gates,
  photolithography and etching of a via location in the dielectric layer at the first gate or the first of the two gates,
  deposit a first conducting material partly filling the location etched in the dielectric layer, forming a via electrically contacting the first gate or the first of the two gates,
  deposit a second conducting material in the location etched in the dielectric layer on the via, forming a metallic portion.

The second electrical contact may be made by at least the following steps:
  photolithography and etching of a via location in the support layer at the second gate or the second of the two gates,
  deposit a first conducting material partly filling the location etched in the support layer, forming a via electrically contacting the first face of the second gate or the second of the two gates,
  deposit a second conducting material in the location etched in the support layer on the via, forming a metallic portion.

The method may also comprise a step to silicate the first face of the second gate or the second of the two gates, between the photolithography and etching step of the via location in the support layer, and the step to deposit the first conducting material in this location.

This invention also relates to a method for making a field effect transistor, comprising at least the following steps:
  photolithography and etching of a plurality of gate locations in an active layer based on at least one semiconductor, located on a support layer, forming a plurality of active zones in the active layer, each zone being designed to form a channel and being arranged between two gate locations located adjacent to each other and consecutive,
  deposit a gate material at least in the gate locations, forming a plurality of gates each comprising a first face on the side of the support layer, and a second face opposite the first face, each active zone being arranged between two gates located adjacent to each other and consecutive,
  make a first electrical contact on the second face of each of one of the two gates, this first contact being electrically connected to the second face of said one of the two gates,
  make a second electrical contact through the support layer, electrically connected to the first face of each of the other of the two gates.

The method may also comprise a step to make source and drain zones in the active layer between the step to deposit the gate material and the step to make the first electrical contact, implementation of the step to make the first electrical contact and/or the step to make the second electrical contact through the support layer also forming metallic portions electrically connected to the source and drain zones on the side of one face of the support layer comprising the first electrical contact and/or on the side of the other face of the support layer comprising the second electrical contact through the support layer.

Thus, the source and drain zone contacts and gate contacts located on one side and/or the other side of the transistor may be made simultaneously.

BRIEF DESCRIPTION OF THE DRAWINGS

This invention will be better understood after reading the description of example embodiments given purely for information and that are in no way limitative with reference to the appended drawings in which.

Identical, similar or equivalent parts of the different figures described below are assigned the same reference numbers, so as to facilitate the comparison between one figure and the next.

The different parts shown in the figures are not necessarily all shown to the same scale, to make the figures more easily readable.

It must be understood that the different possibilities (variants and embodiments) are not mutually exclusive and can be combined.

DETAILED DESCRIPTION OF PARTICULAR EMBODIMENTS

A method for making a field effect transistor, in this case a FinFET 100, will now be described with reference to FIGS. 3A to 3P.

Figure 1:
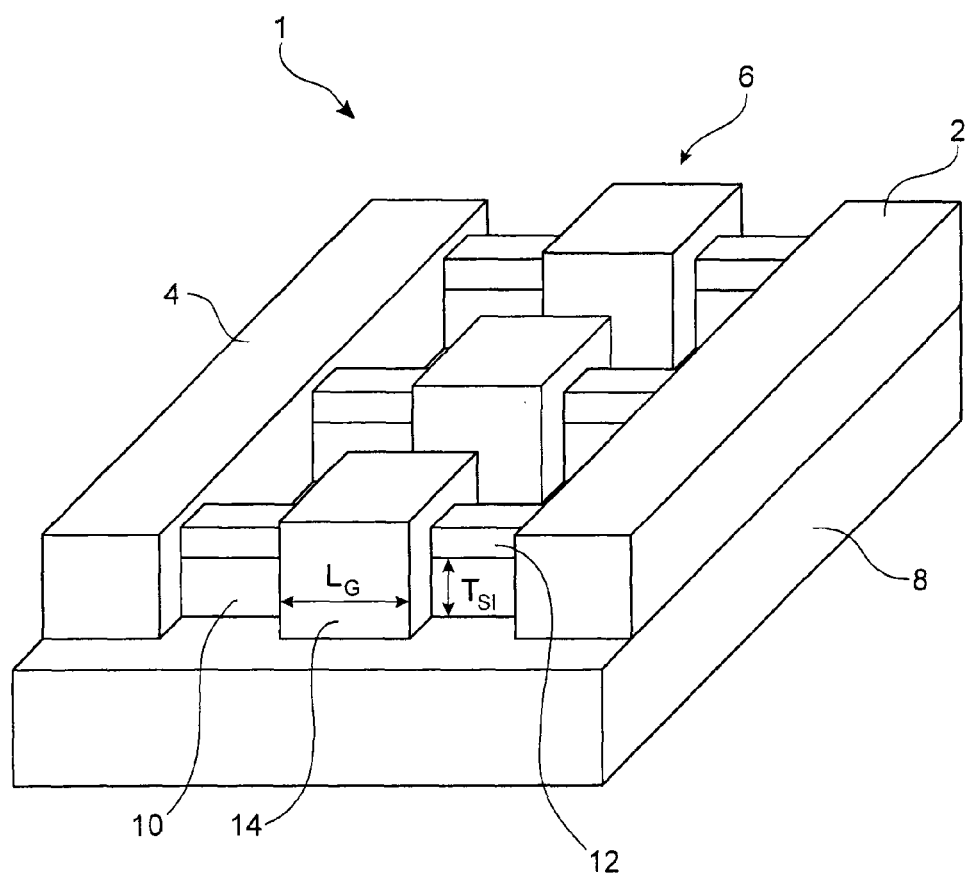
FIG. 1 shows a FinFET with connected gates according to prior art.
Figure 2A:
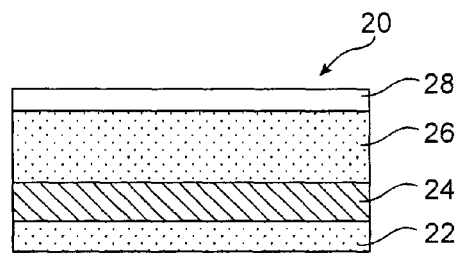
FIGS. 2A to 2E show the steps in a method for making a disconnected gates FinFET according to prior art.
Figure 2B:
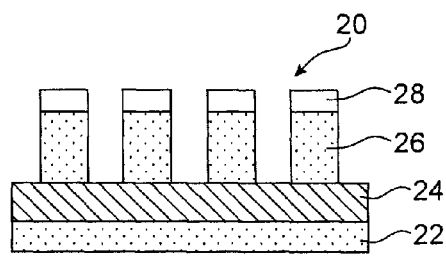
Figure 2C:
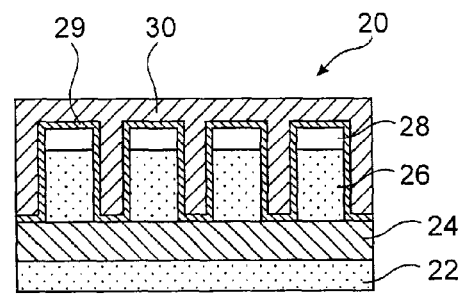
Figure 2D:
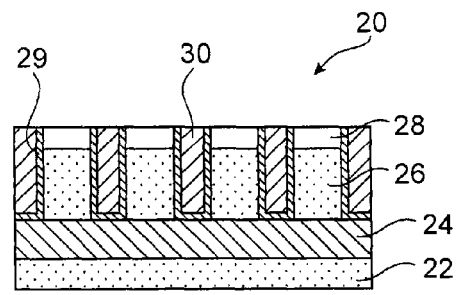
Figure 2E:
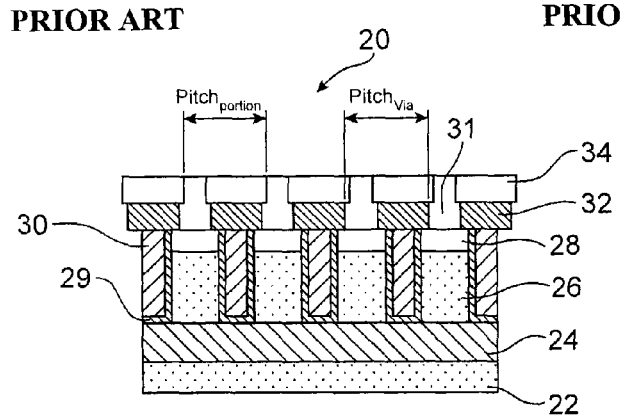
Figure 3A:
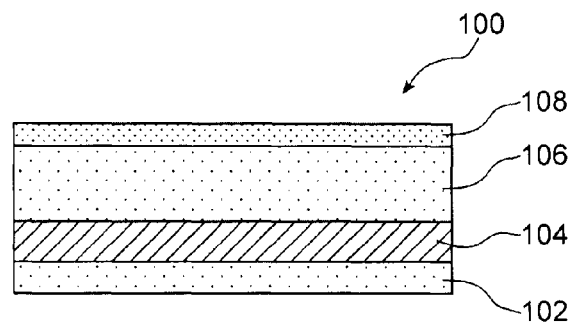
FIGS. 3A to 3P show the steps in a method for making a field effect transistor according to this invention.

As shown in FIG. 3A, the first step is to deposit a hard mask 108 on a semiconductor on insulator type substrate comprising a substrate 102, a support layer 104 and an active layer 106, for example by an LPCVD (low pressure chemical vapour deposition) type deposit.

The material from which the substrate 102 is made is preferably chosen so that it can easily be consumed chemically and/or mechanically, for example Si. In this example embodiment, the support layer 104 is based on at least one dielectric material such as $SiO_2$. The active layer 106 is based on at least one semiconductor, in this case Si. The active layer 106 may also be based on SiGe and/or Ge and/or any type III-V material (GaAs, InGaAs, GaN, InP, etc.). Finally, in this case the hard mask 108 comprises a layer based on $SiO_2$ and/or a nitride layer. Advantageously, the hard mask 108 comprises an $SiO_2$ and nitride bi-layer. For a substrate diameter equal to about 200 mm, the thickness of the substrate 102 may for example be equal to about 750 µm, the thickness of the support layer 104 may be equal to about 200 nm, and the thickness of the active layer 106 may be equal to about 40 nm.

Figure 3B:
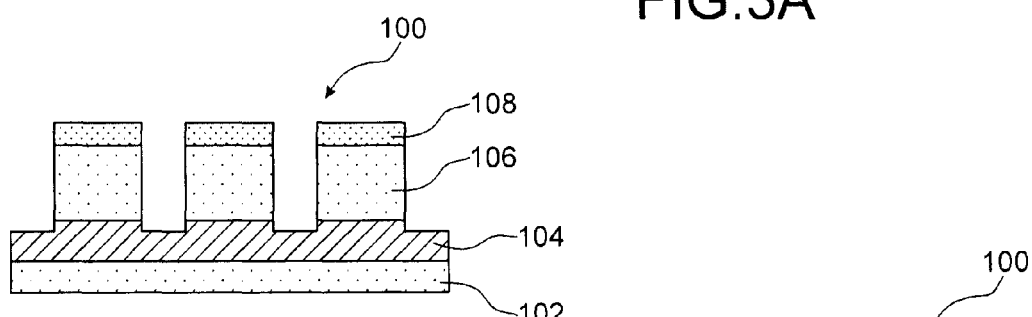
Figure 3C:
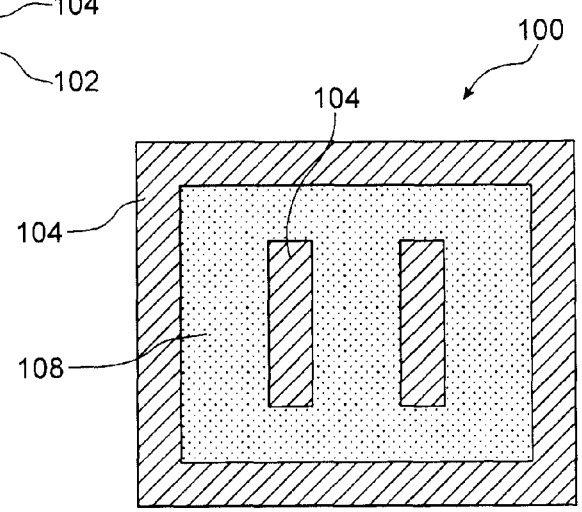

The next step is an electron beam photolithography step to define the locations of the gates, source and drain zones and channels that will be made in the active layer 106 of the FinFET 100. The next step is to etch the pattern previously defined by photolithography in the hard mask 108 and the active layer 106, using anisotropic etching. Etching is also done partly in the support layer 104 without passing through it completely. Thus, recesses are formed in the support layer 104, in which gates will be made later. FIGS. 3B and 3C show a sectional view and a top view respectively of the FinFET 100 after etching.

Figure 3D:
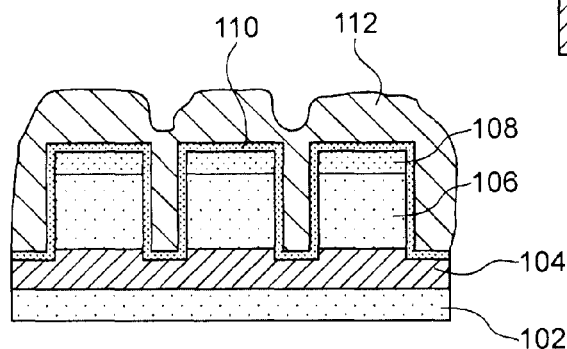
Figure 3E:
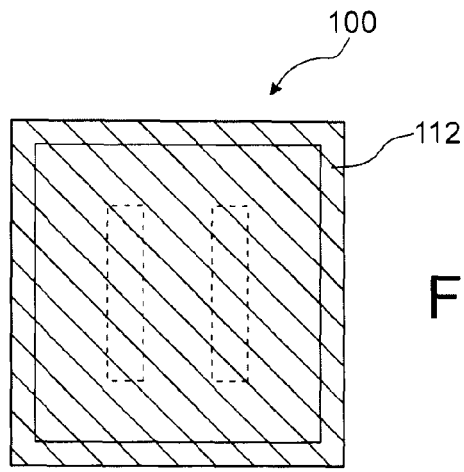

The next step is to deposit a gate dielectric 110, for example based on $HfO_2$, for example using a CVD (chemical vapour deposition) on the entire device 100, in other words on the hard mask 108 and in the previously etched locations. The gate dielectric 110 deposited on the hard mask 108 and on the support layer 104 is also in contact with the side walls of the active layer 106 exposed during the previous etching step of the hard mask 108 and the active layer 106. A gate material 112, for example based on a metal and/or polysilicon, for example a bi-layer of metal (for example TiN)/polysilicon is then deposited on the gate dielectric 110 by LPCVD. FIGS. 3D and 3E show a sectional view and a top view respectively of the FinFET 100 after deposition of the gate dielectric 110 and the gate material 112.

In general, the gate material 112 and the gate dielectric 110 may be based on any material capable of obtaining a gate stack such as SiON/polysilicon, $SiO_2$/polysilicon, $HfO_2$/TiN/polysilicon, $SiO_2$/metal, etc. Furthermore, such a gate stack is not limited to two different materials, the gate material 112 and the gate dielectric 110 possibly being based on several materials.

Figure 3F:
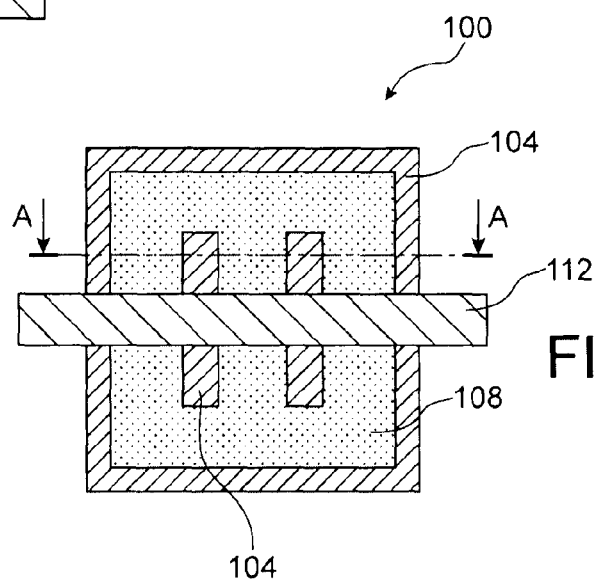
Figure 3G:
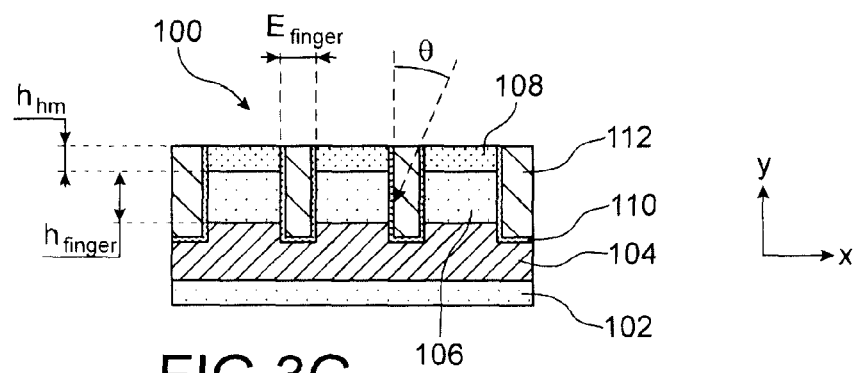

The next step is photolithography and etching of the gate material 112 and the gate dielectric 110 such that the remaining portions or fingers of this gate stack form the gates and gate dielectrics of the FinFET 100, as shown in FIG. 3F (top view). The next step is LDD (lightly doped) implantations in portions of the active layer 106 that will form part of the source and drain of the FinFET 100. For each of these portions of the active layer 106, two implantation steps are implemented to make the LDD zones on each side of the portions of the active layer 106. These implantation steps are done by oblique beams at angles θ and −θ (see FIG. 3G, where |θ| is the value of the angle between the beam used for the implantation and a straight line parallel to the y axis). The maximum value of |θ| is determined by the formula:

$$\mathrm{Tan}(\theta_{max}) = E_{finger} / (h_{finger} h_{hm}), \text{ where}$$

$E_{finger}$: distance between two consecutive portions or fingers of the active layer 106 that will form part of the source and drain zones;

$h_{finger}$: height of the active layer 106, $h_{hm}$: height of the hard mask 108.

In this case, the type of the LDD implantations is opposite to the doping of the substrate 102. For example, LDD implantations for a P type substrate 102 are made with N type doping agents.

An implantation of doping agent pockets is also made in the active layer 106 at the boundary between the zones that will form the source and the drain and the zones that will form the channels. Two implantation steps are made with inclined ion beams, in order to implant these pockets on the side of the source and also on the side of the drain. In this case, the doping agents of these pockets are of the same type as the doping agents of the substrate 102.

Figure 3H:
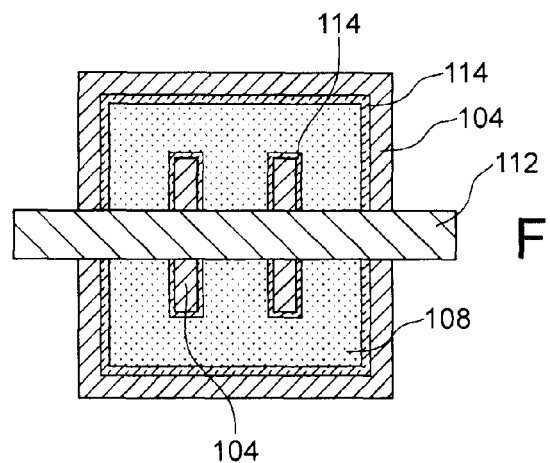

As shown in FIG. 3H, the next step is to make spacers 114 on the support layer 104, along the sidewalls of the active layer 106 exposed during the first etching step and the gates 112, by depositing a dielectric material such as $SiO_2$ and etching it according to the required pattern. The next step is HDD (highly doped) implantations to form the source and drain zones. These highly doped implantations are made using doping agents of the type opposite to the doping of the substrate 102.

Figure 3I:
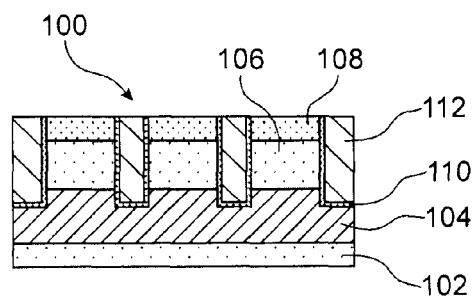
Figure 3J:
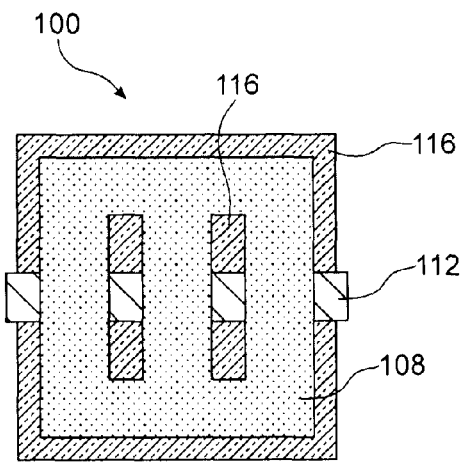

A dielectric material 116, for example based on oxide such as $SiO_2$, is deposited on the entire FinFET 100, particularly covering portions of the support layer 104 that are not covered by spacers 114. A mechanical-chemical planarization stopping at the hard mask 108 eliminates portions of gate material 112 and the dielectric material 116 at a level above the hard mask 108, and forms a plane face of the FinFET 100 (FIGS. 3I and 3J). The dielectric material 116 thus forms shallow isolation trenches (STI) protecting portions of the support layer 104 that are still visible after the spacers 114 have been produced.

Figure 3K:
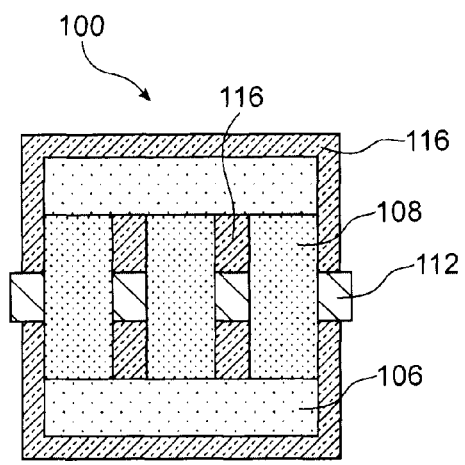

As shown in FIG. 3K, photolithography and etching are done on part of the hard mask 108 to expose part of the source and drain zones of the active layer 106. The remaining portions of the hard mask 108 protect the fingers formed in the active layer 106.

Figure 3L:
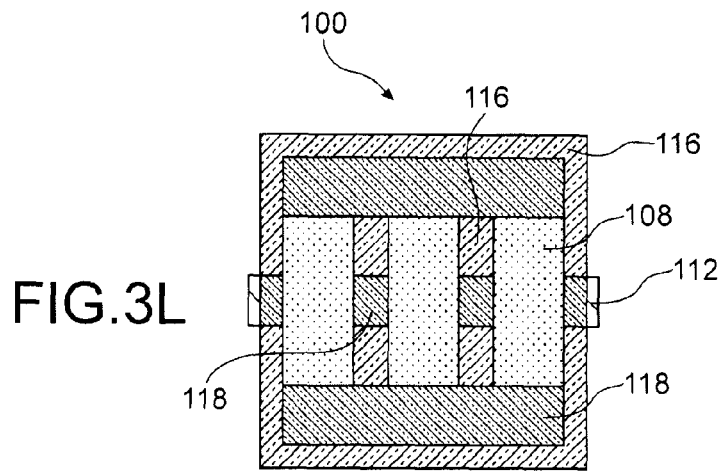

The next step in FIG. 3L is siliciding of exposed portions of the source and drain zones of the active layer 106 and gates 112. This is done by depositing a metal, for example cobalt and/or platinum and/or palladium and/or nickel on zones on which a metal-semiconductor alloy, or any other metal that can form a metal-semiconductor alloy, is to be made, and for example silicide as in this example embodiment, or germanide or germanosilicide. A first annealing forms the silicide 118. The nickel that has not reacted is then selectively removed. Finally, a second annealing reduces the resistivity of the silicide 118.

Figure 3M:
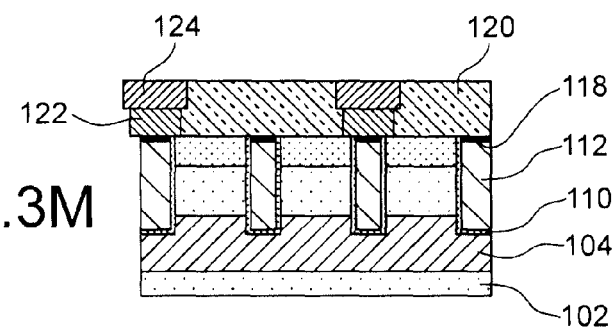
Figure 3N:
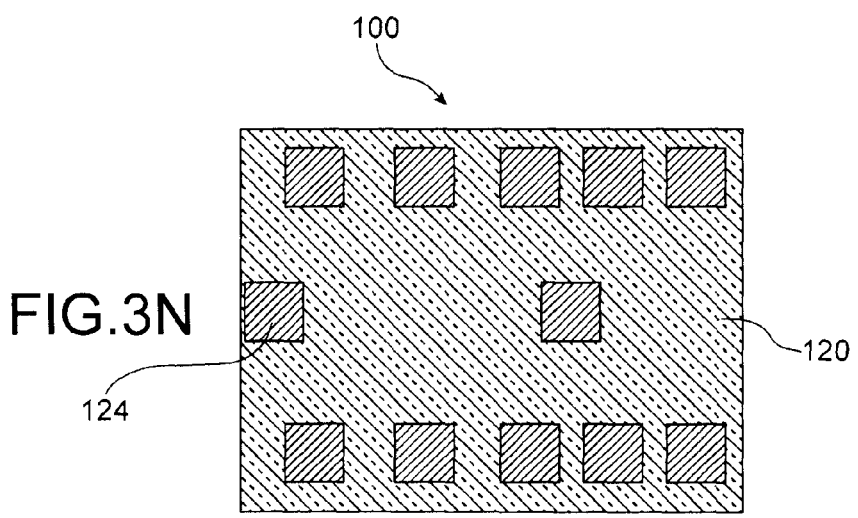

The next step is to form first electrical contacts on a first face of the FinFET 100. This is done by depositing a dielectric layer 120, for example $SiO_2$, by PECVD (plasma enhanced chemical vapour deposition) on the face of the FinFET 100 on which the hard mask 108, called the first face, is located. The next step is photolithography defining the locations of the electrical contacts that will be made on the first face of the FinFET 100 and anisotropic etching of the dielectric layer 120. A deposit of Ti/TiN forming a diffusion barrier and then a tungsten deposit in the locations etched in the dielectric layer 120 forms vias 122. A mechanical-chemical planarization then avoids short circuits by only putting metal in the contact holes or vias. Finally, depositing metal such as aluminium on vias 122 produces metallic portions 124. These first electrical contacts formed by the silicide 118, the vias 122 and the metallic portions 124, provide contact with some of the gates of the FinFET 100 and the source and drain zones at the same time (FIGS. 3M and 3N). A photolithography and etching step defines and makes the metal tracks of a first level of interconnections made at these first electrical contacts. Other interconnection levels connected to this first interconnection level can then be made, for example by photolithography and etching.

The FinFET 100 comprises a plurality of gates 112 located adjacent to each other, separated by fingers formed in the active layer 106. These first electrical contacts are made so as to contact one gate 112 out of two. Assuming that each finger in the active layer 106 is arranged between two gates 112, only one of the two gates is connected to a first electrical contact as produced above. Similarly, first electrical contacts are also made at the source and drain zones. In the example in FIG. 3N, the source and drain zones are connected to contacts formed on the first face of the FinFET 100.

Figure 3O:
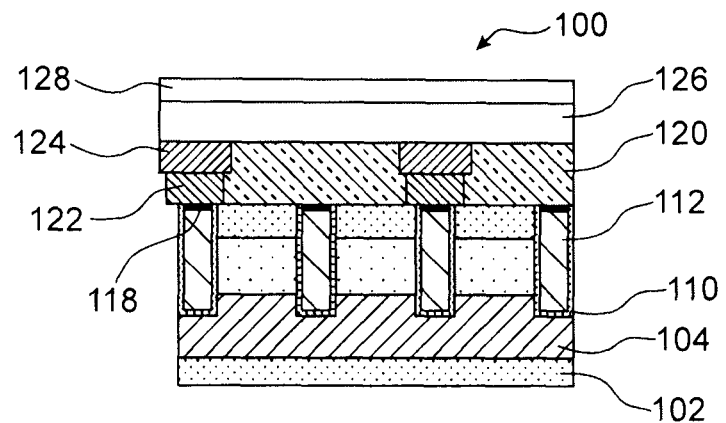

As shown in FIG. 3O, the next step is to deposit another dielectric layer 126, for example based on $SiO_2$, on the dielectric layer 120 and on metallic portions 124 made on the first face, and this dielectric layer 126 is then planarized. A second substrate 128 is then glued by molecular bonding onto this other dielectric layer 126.

Figure 3P:
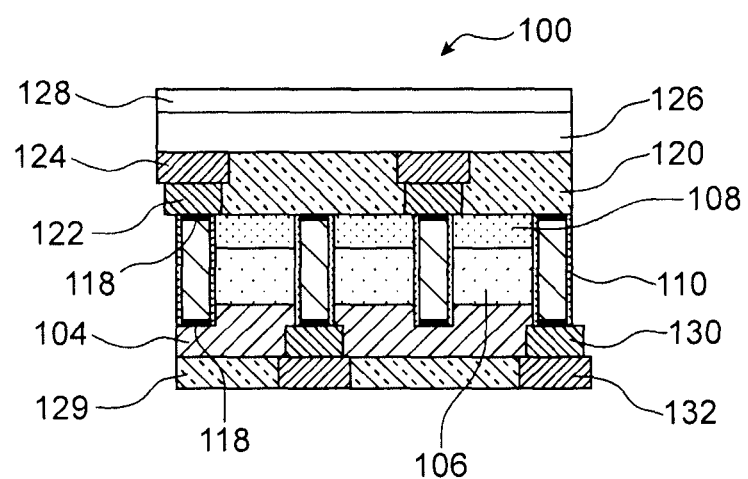

Finally in FIG. 3P, the first substrate 102 is eliminated by grinding and/or by a chemical method (for example using a solution of tetramethylammonium hydroxide (TMAH)). Vias 130 and metallic portions 132 are then made at the second face of the FinFET 100, so as to contact gates that are not contacted by the first electrical contacts and to form second electrical contacts. In FIG. 3O, these gates are silicidated in a manner similar to siliciding described above. Similarly, the vias 130 and metallic portions 132 are made in a similar manner to the vias 122 and metallic portions 124 on the first face of FinFET 100 (other dielectric layer 129, photolithography, etching, metallic deposit). Interconnection levels can then be made for example by photolithography and etching, connected to the second electrical contacts.

Thus, in an alternate manner, the gates 112 are connected to a first electrical contact and to a second electrical contact on each side of the transistor.

In one variant, instead of being made on the first face of the FinFET, the electrical contacts formed at the source and drain zones may be made on the second face of the FinFET 100 opposite the first face. In another variant, the electrical contacts formed at the source and drain zones may be made on both sides of FinFET 100, in other words both on the first face and the second face of the FinFET 100.

The following table presents the minimum pitch to be respected between the fingers formed in a FinFET comprising all contacts on a single face (second column, the pitch between the fingers corresponding to the pitch of the metallic portions) and the minimum pitch to be respected between the fingers formed in a FinFET comprising contacts distributed alternately on the two faces as described above (third column, the pitch between the fingers corresponding to the misalignment of vias within five standard deviations+size of vias after etching) for different technological nodes. The fourth column in the table expresses the gain in % obtained over the minimum distance between the fingers for such a transistor, corresponding to the possible reduction in area used to make the transistor.

| Technological node (nm) | Pitch of fingers for contacts distributed on the two faces (in nm) | Pitch of fingers for contacts on a single face (in nm) | Area reduction (in %) |
|---|---|---|---|
| 65 | 82.3 | 130 | 37 |
| 45 | 58.3 | 90 | 35 |
| 32 | 41.5 | 64 | 35 |
| 22 | 29.7 | 44 | 33 |
| 16 | 20.7 | 32 | 35 |

It can then be seen that an average gain of 35% is obtained on the minimum distance to be respected between the fingers.

The field effect transistors described above are used in applications in many fields.

Figure 4:
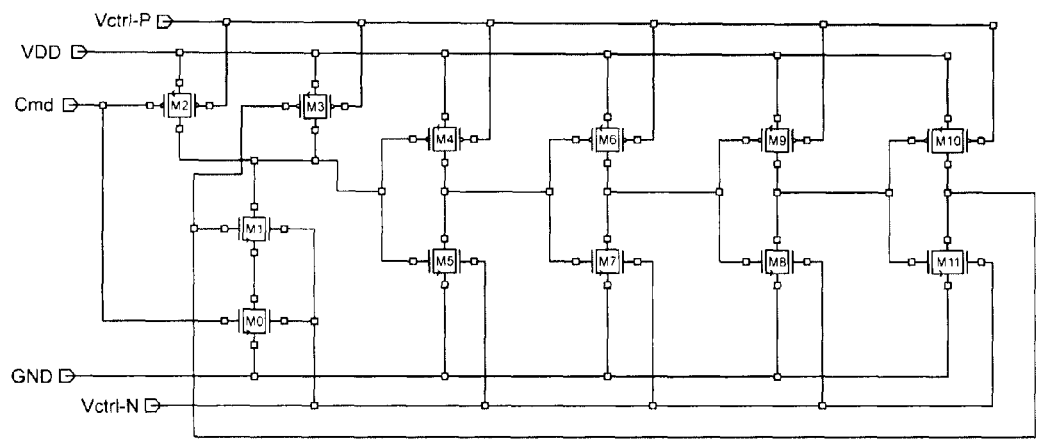
FIG. 4 shows an electrical diagram for a ring oscillator made from self-aligned double gate transistors according to this invention.
Figure 5:
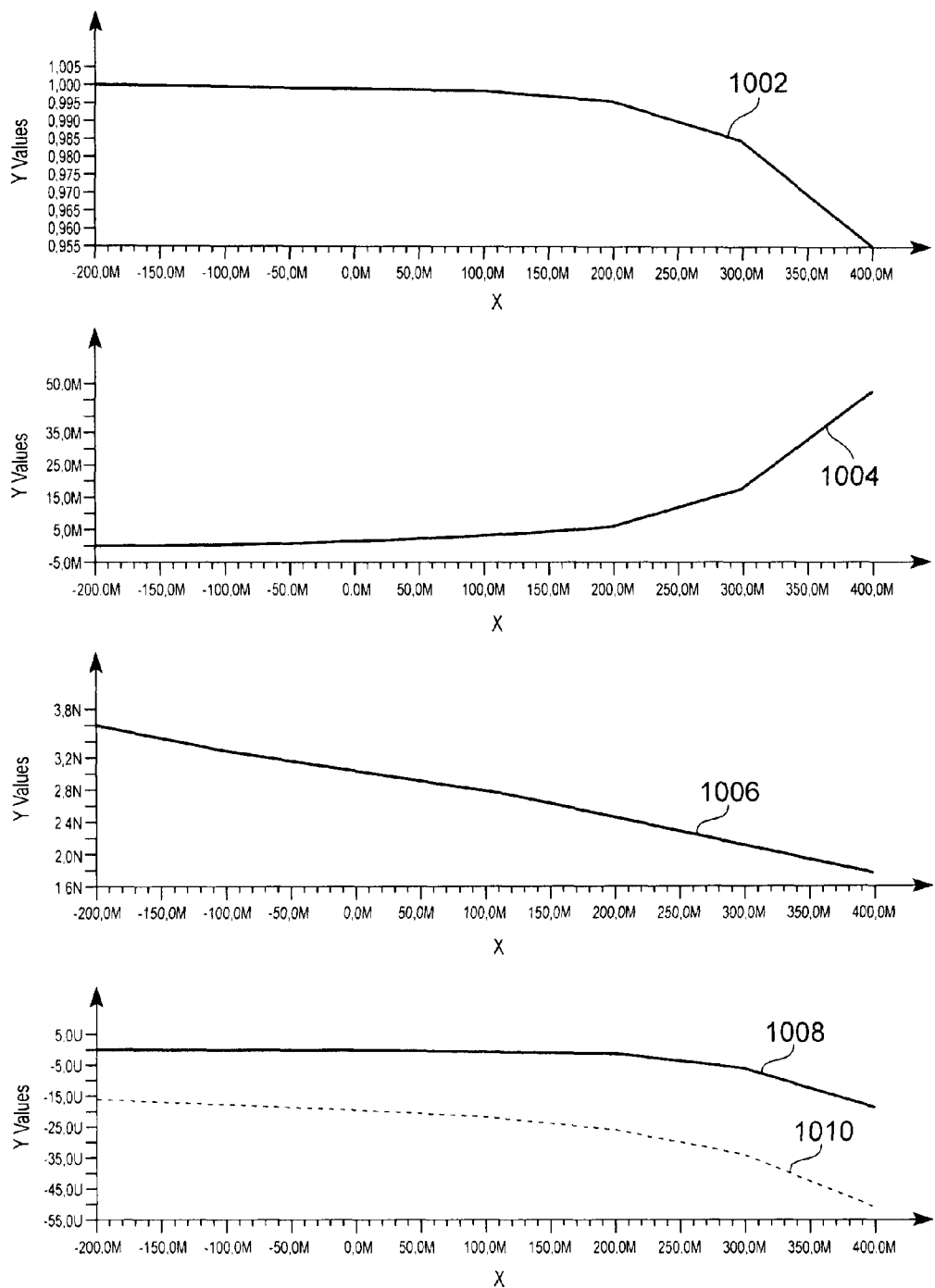
FIG. 5 shows electrical simulations for operation of the ring oscillator shown in FIG. 4.

One module performing a logical function comprises various elements such as inverter switches, simple logical gates (NOR, NAND, etc.) or more complex gates (OR-AND, AND-OR, etc.), or flip flops and/or memory elements. Depending on the usage context, it may be useful to control the operating rate of this module in relation to its consumption. For example, such a module may be a ring oscillator 1000 made from several independent self-aligned double gate transistors shown in FIG. 4, for which operation is controlled through a CMD signal. Electrical simulations of this oscillator 1000 are shown in FIG. 5. Curves 1002, 1004, 1006, 1008 and 1010 represent variations of parameters of the oscillator 1000 as a function of voltage values Vctrl_N and Vctrl_P, Vctrl_N being equal to the value shown on the X axis and Vctrl_P being equal to the value VDD−Vctrl_N. Curve 1002 represents variations of the maximum voltage of the oscillation signal obtained during operation of the oscillator 1000. Curve 1004 represents the minimum voltage of this oscillation signal. Curve 1006 represents the period of the output signal from the oscillator 1000. Curve 1008 represents the static consumption of oscillator 1000 when the Cmd signal is equal to '0'. Curve 1010 represents the dynamic consumption of oscillator 1000 when the Cmd signal is equal to '1'.

Starting from the results obtained on these curves, it can be seen that the oscillation period obtained varies between about 3.6 ns and 2 ns, that dynamic consumption varies between about 15 µA and 50 µA and that the static consumption varies between about 0 and 20 µA. It can also be seen that the optimum operating range of this oscillator 1000 is obtained when Vctrl_N is between about −0.2 V and 0.2 V for the technology considered.

The independent double gates enable control of the operating rate of the oscillator through control of the transistor switching time while optimising consumption of the circuit. Therefore, the electrical performances of a logical module are optimised by varying the electrical schemes according to the invention while minimising its impact in terms of area, to give better results than are possible with a scheme according to prior art.

Figure 6:
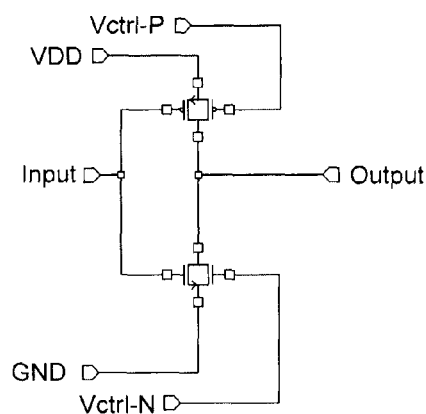
FIG. 6 shows an example logical buffer made from double gate transistors according to the invention.

FIG. 6 shows a logical buffer 2000 made from independent double gate transistors like those previously described. In this FIG. 6, this buffer has been minimised to an inverter switch with two double gate transistors, for reasons of clarity. Integration density constraints are important for implantation of such a logical buffer or any other logical function comprising active transistors with a minimum channel length L and a large transistor width W, for example such that W>20×L. When FinFET type transistors are used, these constraints result in transistors comprising a large number of fingers. In the example shown in FIG. 6, the PMOS of this buffer 2000 comprises 40 fingers and the NMOS comprises 20 fingers.

For example, for a finger height of 100 nm and a W of 2 µm, this device requires 20 fingers. Contact recovery constraints require that the proposed technique is used to increase the component implantation density.

Thus, this invention can increase the integration density of these transistors by reducing the necessary space between the fingers of these transistors.

The invention claimed is:

1. A field effect transistor comprising:
   a support layer; and
   a plurality of active zones based on at least one semiconductor, each active zone being configured to form a channel and arranged between alternating first and second gates adjacent to each other, the active zones and the first and second gates being arranged on the support layer, each gate of the first and second gates includes a first face on a side of the support layer and a second face opposite the first face, wherein the second face of each of the first gates is electrically connected to a first electrical contact made on the second face of each of the first gates, the first face of each of the second gates is electrically connected to a second electrical contact passing through the support layer, the first electrical contacts are distinct from the first gates, and the second electrical contacts are distinct from the second gates, and the first gates are not electrically connected to each other, the second gates are not electrically connected to each other, and the first gates are not electrically connected to the second gates.

2. The transistor according to claim 1, wherein the support layer comprises recesses in which the first and second gates are arranged.

3. The transistor according to claim 1, wherein the support layer is based on at least one dielectric material, or based on at least one material that can be selectively etched relative to the other materials in the transistor, or a combination thereof.

4. The transistor according to claim 1, further comprising a portion of a hard mask arranged on the active zones.

5. The transistor according to claim 1, wherein the portion of the hard mask comprises at least one oxide layer or $SiO_2$ and/or a nitride layer.

6. The transistor according to claim 1, wherein the active zones are based on at least one of a stressed or unstressed semiconductor, Si, Ge, SiGe, or any type III-V semiconductor, and the first and second gates are based on at least one metallic material or polysilicon and are partly surrounded by at least one gate dielectric based on at least one of SiON, $SiO_2$ or $HfO_2$.

7. The transistor according to claim 1, further comprising a dielectric material, at least partly covering portions of the support layer and forming isolation trenches.

8. The transistor according to claim 7, wherein the dielectric material is $SiO_2$.

9. The transistor according to claim 1, wherein at least one of the first electrical contact or the second electrical contact further comprises silicide portions formed in contact with at least one of the first or second face of at least one of the first or second gates.

10. The transistor according to claim 1, wherein at least one of the first electrical contact or the second electrical contact comprises a via based on a first conducting material and a metallic portion based on a second conducting material, the via being arranged between the metallic portion and at least one of the first or second gates.

11. The transistor according to claim 1, further comprising dielectric spacers arranged on the support layer and at least in contact with the first and second gates.

12. The transistor according to claim 1, wherein the transistor is FinFET.

13. The transistor according to claim 1, further comprising source and drain zones formed in the active zones and electrically connected to electrical contacts.

14. The transistor according to claim 1, wherein the support layer includes one or more of $SiO_2$, $Al_2O_3$, Si, or SiGe.

* * * * *